(12) United States Patent
Hsueh et al.

(10) Patent No.: US 9,178,152 B2
(45) Date of Patent: Nov. 3, 2015

(54) METAL ORGANIC CHEMICAL VAPOR DEPOSITION OF EMBEDDED RESISTORS FOR RERAM CELLS

(71) Applicant: Intermolecular Inc., San Jose, CA (US)

(72) Inventors: Chien-Lan Hsueh, Campbell, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 11 days.

(21) Appl. No.: 14/139,186

(22) Filed: Dec. 23, 2013

(65) Prior Publication Data

US 2015/0179937 A1 Jun. 25, 2015

(51) Int. Cl.
*H01L 21/20* (2006.01)
*H01L 45/00* (2006.01)
*H01L 27/24* (2006.01)

(52) U.S. Cl.
CPC ............ *H01L 45/1616* (2013.01); *H01L 45/08* (2013.01); *H01L 45/12* (2013.01); *H01L 45/1233* (2013.01); *H01L 45/146* (2013.01); *H01L 45/16* (2013.01); *H01L 27/2481* (2013.01)

(58) Field of Classification Search
None
See application file for complete search history.

(56) References Cited

U.S. PATENT DOCUMENTS

| | | | | |
|---|---|---|---|---|
| 6,084,279 | A * | 7/2000 | Nguyen et al. | ............. 257/412 |
| 6,706,115 | B2 | 3/2004 | Leskela et al. | |
| 6,946,673 | B2 | 9/2005 | Zonca et al. | |
| 7,271,081 | B2 | 9/2007 | Li | |
| 7,633,108 | B2 | 12/2009 | Li | |
| 2003/0108674 | A1 * | 6/2003 | Chung et al. | ............ 427/255.394 |
| 2007/0259502 | A1 * | 11/2007 | Bour et al. | ..................... 438/285 |
| 2008/0081113 | A1 * | 4/2008 | Clark | ...................... 427/255.394 |
| 2008/0203377 | A1 * | 8/2008 | Choi et al. | ......................... 257/5 |
| 2011/0233503 | A1 * | 9/2011 | Hwang | ............................ 257/2 |
| 2013/0028003 | A1 | 1/2013 | Wang | |
| 2013/0168817 | A1 * | 7/2013 | Kawahara et al. | ............ 257/537 |
| 2014/0239373 | A1 * | 8/2014 | Murakoshi et al. | ........... 257/324 |

OTHER PUBLICATIONS

Nardi, F., et al.; Control of Filament Size and Reduction of Reset Current Below 10 uA in NiO Resistance Switching Memories; Jan. 1, 2011; Academia—Politecnico di Milano; SolidState Electronics pp. 4247.

Wong, J., et al.; Thin Film Embedded Resistors; ; Gould Electronics.

(Continued)

*Primary Examiner* — Mamadou Diallo
*Assistant Examiner* — Jay C Chang (57) ABSTRACT

Provided are resistive random access memory (ReRAM) cells and methods of fabricating them using metal organic chemical vapor deposition (MOCVD). Specifically, MOCVD is used to form an embedded resistor that includes two different nitrides. The first nitride may be more conductive than the second nitride. The concentrations of these nitrides may vary throughout the thickness of the embedded resistor. This variability may be achieved by changing flow rates of MOCVD precursors during formation of the embedded resistor. The second nitride may be concentrated in the middle of the embedded resistor, while the first nitride may be present at interface surfaces of the embedded resistor. As such, the first nitride protects the second nitride from exposure to other components and/or environments and prevents oxidation of the second nitride. Controlling the distribution of the two nitrides within the embedded resistor allows using new materials and achieving consistent performance of the embedded resistor.

20 Claims, 6 Drawing Sheets

(56) References Cited

OTHER PUBLICATIONS

Chen, A.; Current Overshoot During Set and Reset Operations of Resistive Switching Memories; Jan. 1, 2012; IEEE; pp. MY0201MY02.4.

Nardi, F., et al.; Reset Current Reduction and SetReset Instabilities in Unipolar NiO RRAM; Jan. 1, 2011; IEEE; 4 pages.

Jae Hyuck Jang, et al.; Role of Carbon on Resistivity and Structure of HfCxNy Films Grown by Low Temperature MOCVD; Sep. 8, 2008; Department of Materials Science and Engineering, and Inter-University Semiconductor Research Center, Seoul National University, Seoul Korea.

W.W Wang, et al.; Effect of NH3 on the Fabrication of HfN as GateElectrode using MOCVD; ; Elsevier Sequoia.

* cited by examiner

METAL ORGANIC CHEMICAL VAPOR DEPOSITION OF EMBEDDED RESISTORS FOR RERAM CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof using metal organic chemical vapor deposition (MOCVD). Specifically, MOCVD is used to form an embedded resistor that includes two different nitrides. The first nitride may be more conductive than the second nitride. The concentrations of these nitrides vary throughout the thickness of the embedded resistor. This variability may be achieved by changing flow rates of MOCVD precursors during formation of the embedded resistor. The second nitride may be concentrated in the middle of the embedded resistor, while the first nitride may be present at interface surfaces of the embedded resistor. As such, the first nitride protects the second nitride from exposure to other components and/or environments and prevents oxidation of the second nitride. Controlling the distribution of the two nitrides within the embedded resistor allows using new materials and achieving consistent performance of the embedded resistor.

In some embodiments, a method of fabricating a ReRAM cell involves providing a substrate including a conductive layer operable as an electrode. The method may proceed with forming an embedded resistor over the conductive layer. The embedded resistor formed using MOCVD and includes a first element, a second element, and nitrogen. As such, the embedded resistor may include a first nitride including the first element and a second nitride including the second element. The method may also involve forming a variable resistance layer over the conductive layer.

In some embodiments, the concentration of the first element varies throughout the thickness of the variable resistance layer, i.e., between the two interface surfaces. Likewise, the concentration of the second element may vary throughout the thickness of the variable resistance layer. For example, the concentration of the second element at both interface surfaces of the variable resistance layer may be about 0% atomic.

In some embodiments, the first nitride is more conductive than the second nitride. For example, the first element forming the first nitride may be one of hafnium, tantalum, titanium, zirconium, chromium, nickel, or cobalt. The concentration of the first element may be the lowest away from the interface surfaces of the variable resistance layer. The second element forming the second nitride may be one of aluminum, silicon, germanium, sulfur, selenium, and gallium. The concentration of the second element may vary also throughout the thickness of the variable resistance layer. For example, the concentration of the second element may be the highest away from the interface surfaces of the variable resistance layer. In some embodiments, the atomic ratio of the second element to the combination of the first element and the second element is between about 1% and 5%. The embedded resistor may include one of hafnium silicon nitride, hafnium aluminum nitride, tantalum silicon nitride, or tantalum aluminum nitride. In some embodiments, the second element is present in less than about 50% of the thickness of the variable resistance layer.

In some embodiments, forming the variable resistance layer involves flowing a first metal organic precursor and flowing a second metal organic precursor into a MOCVD chamber. The first metal organic precursor includes the first element, while the second metal organic precursor includes the second element. The flow rates of the first metal organic precursor and the second metal organic precursor may be dynamically varied while forming the variable resistance layer. In some embodiments, forming the variable resistance layer starts and ends with the second metal organic precursor not flowing into the MOCVD chamber. Forming the variable resistance layer also involves flowing a nitrogen containing precursor into the MOCVD chamber. The flow rate of the nitrogen containing precursor may be dynamically varied while forming the variable resistance layer.

While the embedded resistor is formed using MOCVD, the variable resistance layer may be formed using other deposition methods. For example, the variable resistance layer may be formed using atomic layer deposition (ALD). In some embodiments, both the embedded resistor and the variable resistance layer are formed using MOCVD. In some embodiments, the variable resistance layer is formed before the embedded resistor, and the embedded resistor is formed over the variable resistance layer. Alternatively, the variable resistance layer may be formed after the embedded resistor, and wherein the variable resistance layer is formed over the embedded resistor. The embedded resistor has a thickness of between about 10 nanometers and 50 nanometers. Forming the embedded resistor is performed in a continuous manner.

In some embodiments, a method of fabricating a ReRAM cell involves providing a substrate including a conductive layer operable as an electrode. The substrate may be at the temperature of between about 300° C. and 450° C. The method may proceed with forming an embedded resistor over the conductive layer. This forming operation may involve: flowing tris(diethylamido) (tert-butylimido) tantalum and a nitrogen containing precursor into a MOCVD chamber, reducing the flow rate of tris(diethylamido) (tert-butylimido) tantalum and increasing the flow rate of tris(dimethylamino) silane, and then increasing the flow rate of tris(diethylamido) (tert-butylimido) tantalum and stopping the flow of tris(dimethylamino) silane.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

A ReRAM cell exhibiting resistive switching characteristics generally includes multiple layers formed into a stack. The stack includes two conductive layers operating as electrodes. These layers may be formed from metals or other conductive materials, such as polysilicon and metal nitrides. The stack also includes an insulator layer disposed between the two electrodes and configured to change its resistive properties when switching voltages are applied to tis insulator layer. This layer may be referred to as a variable resistance layer. The changes in the resistive properties are used to store data. For example, one resistive state may be associated with a logic "zero", while the other resistive state may be associated with a logic "one" value.

The variable resistance layer changes its resistive state when a switching voltage is applied, for example, as a series of pulses of increase voltage values. For example, a switching voltage pulse may be followed by a smaller reading voltage pulse to determine the current state of the ReRAM cell at that time. Unlike the switching voltage pulse, the reading pulse is specifically configured to avoid changing the resistive state of the variable resistance layer and is configured only to determine its resistive current state. As such, reading pulses are used for feedback control. The switching pulse may be repeated if needed, for example, if the desired resistive state is not reached. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the variable resistance layer is a dynamic process that needs to be well controlled to prevent over-programming. For example, when the variable resistance layer is switched from its high resistive state (HRS) to its low resistive state (LRS), a rapid drop in resistance associated with this switch may cause an excessive current through the variable resistance layer and over-programming. The over-programming occurs when the change in resistance continues even after the variable resistance layer reaches its desirable resistance. One approach to prevent such over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have many drawbacks, such as requiring more pulses or higher voltages to achieve the same switching result. Furthermore, even during a relatively short switching pulse, the change in resistance may be sufficiently large to result in current spiking and over-programming. In some embodiments, the difference in resistance levels of the LRS and the HRS may be more than an order of magnitude to allow easy differentiation between these states. As a result, the current may spike more than ten times during switching from the HRS to the LRS if the process if not controlled.

To prevent current spiking and over-programming, an embedded resistor may be connected in series with the variable resistance layer and is used to limit the current through the variable resistance layer. The embedded resistor effectively functions as a voltage divider within the ReRAM cell. Unlike the variable resistance layer, the embedded resistor maintains a constant resistance throughout the entire operation of the cell. A relative change of the overall ReRAM cell resistance (expressed as a ratio of the change in the resistance of the ReRAM cell to the overall initial resistance when the variable resistance layer goes between the LRS and the HRS) is less for ReRAM cells with embedded resistors than for similar cells without embedded resistor. This voltage dividing characteristic of the embedded resistor helps to prevent the current spiking and over-programming.

Embedded resistors are subjected to a few design and fabrication constraints. First, the thickness of embedded resistors may be between about 1 nanometer and 100 nanometers or, more specifically, between 10 nanometers and 50 nanometers. In order to achieve an adequate voltage drop, the resistivity of the material forming the embedded resistor has to be between about 0.1-40 Ohm-cm or, more specifically, 1-4 Ohm-cm. Furthermore, these thickness values place significant constraints on fabrication options and even materials selections. Not that many materials can be formed into such thin layers and achieved the desired levels of resistivity as well thermal and electrical stability characteristics. For example, diode activation subjects the entire ReRAM cell including its embedded resistor to a temperature of up to 750° C. or more for up to about 1 minute or more. The embedded may be also subjected to strong electrical fields, e.g., up to 8 mega-Volts/centimeter, which should not change their resistance. Furthermore, techniques used to form embedded resistors may have significant effect on their performance.

Nitrides, such as metal nitrides, are suitable materials for embedded resistor applications. However, many of the materials are susceptible to oxidation and needs to be protected. At the same time, a ReRAM cells may use oxygen containing materials for variable resistance layers and other components that often directly interface embedded resistors. Furthermore, oxygen may come from the environment when, for example, an embedded resistor is formed and not immediately protected by another component.

Conventional processes to form various components of ReRAM cells include atomic layer deposition (ALD) to form, for example, variable resistance layers and physical vapor deposition (PVD) to form, for example, electrodes. However, ALD has a self-limiting nature and forms relatively thin layers, while PVD tends to be difficult to control. For example, each ALD cycle only form a layer of only a few nanometers thick. Furthermore, ALD is generally limited for depositing stoichiometric nitrides. Forming sub-stoichiometric nitrides in a controllable manner is generally not possible with ALD. Yet, sub-stoichiometric nitrides may be particularly useful for embedded resistors since the stoichiometric ratios can be used to tune resistivity of the embedded resistors. Embedded resistors also tend to be relative thick layers and ALD may be too slow and ineffective to deposit these layers.

Provided are ReRAM cells and methods of fabricating thereof using MOCVD. Specifically, MOCVD is used to form an embedded resistor that includes two different nitrides, i.e., a first metal nitride including a first element and a second metal nitride including a second element. The first nitride may be more conductive than the second nitride. The concentrations of these nitrides vary throughout the thickness of the embedded resistor. For example, the second nitride may be concentrated in the middle of the embedded resistor, while the first nitride may be present at interface surfaces of the embedded resistor. In some embodiments, the interface surfaces of the embedded resistor may be substantially free from the second nitride, i.e., the concentration of the second element on these interface surfaces may be about 0% atomic. The first nitride provided on these interfaces protects the second nitride from exposure to other components and/or environments and prevents oxidation of the second nitride. Both nitrides may be formed in situ during the same operation. In other words, the second nitride may never come into direct contact with other components or environments other than the ones used for depositing the first nitride and the second nitride.

This variable composition of the embedded resistor may be achieved by changing flow rates of MOCVD precursors during formation of the embedded resistor. For example, a first precursor may be used for depositing the first nitride, while the second precursor may be used for depositing the second nitride. The process may start with flowing the first precursor into the deposition chamber but not flowing the second precursor into the deposition chamber. As such, the first interface surface may have only the first nitride and not the second nitride. The flow rate of the first precursor may be later reduced and the second precursor may be introduced into the deposition chamber. This portion of the embedded resistor may include both the first nitride and the second nitride. The flow of the second precursor may be then discontinued and the first precursor may be used to form a second interface surface. As such, even though the embedded resistor includes the second nitride, this nitride is protected by the first nitride from the environment that may exist after the embedded resistor is formed. Furthermore, the two nitrides may have different resistivities and their amounts may be specifically varied within the embedded resistor to achieve a desired overall resistance. As such, different resistances can be achieved for the same thickness and cross-sectional area of the embedded resistor. A combination of two nitrides may be used to overcome vulnerable of some nitrides to oxygen, such as oxygen in a variable resistance layer or in the environment. Some nitrides are more resistant to oxygen than others and can be used as a barrier or a protection layer. Furthermore, two different nitrides can be used to tune the resistance of the overall embedded resistor. For example, one nitride may have a lower resistance than the other nitride and relative concentrations of these nitrides may vary to achieve a targeted resistance. Also, some combinations of nitrides and their composition distribution can be used to improve the breakdown strength of the embedded resistor. Overall, controlling the distribution of the two nitrides within the embedded resistor allows using new materials and achieving consistent performance of the embedded resistor.

Examples of ReRAM Cells and Their Switching Mechanisms

A brief description of ReRAM cells is provided for better understanding of various features of variable resistance layers, such as controlling distribution of different nitrides within the embedded resistor using MOCVD, as described in this document. A ReRAM cell includes a variable resistance layer formed from a dielectric material exhibiting resistive switching characteristics. A dielectric, which is normally insulating, can be made more conductive when one or more filaments or conduction paths are formed through the layer. The filaments can be formed based on different mechanisms, such as defect migration with the layer when a voltage is applied to the layer. Once the filaments are initially formed, these filaments may be then at least partially broken and reformed by applying switching voltages.

Figure 1A:
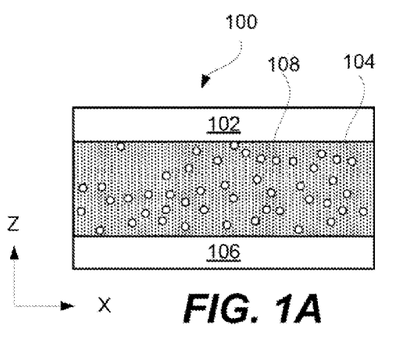
FIGS. 1A and 1B illustrate schematic representations of a ReRAM cell in its high resistive state (HRS) and low resistive state (LRS), in accordance with some embodiments.

FIG. 1A illustrates a schematic representation of ReRAM cell 100 including top electrode 102, bottom electrode 106, and variable resistance layer 104 disposed between top electrode 102 and bottom electrode 106. It should be noted that the "top" and "bottom" references are used solely for differentiation and not to imply any particular spatial orientation of the components. Other references, such as "first" and "second", may be also used identify and distinguish similar components, such as two electrodes, or similar features of the same component, such as two sides of the variable resistance layer.

Variable resistance layer 104 may be initially formed from a dielectric material, such as transition metal oxides and other like materials. Variable resistance layer 104 may be then made to conduct through one or more filaments formed within variable resistance layer 104 by applying a forming voltage or, more specifically, a set of forming pulses. To provide this resistive switching functionality, variable resistance layer 104 may some electrically active defects 108. Electrically active defects 108 may be charge carriers absent from the structure (i.e., vacancies) and/or additional charge carriers introduces into the base material. In some embodiments, electrically active defects 108 may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sub-lattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Figure 1B:
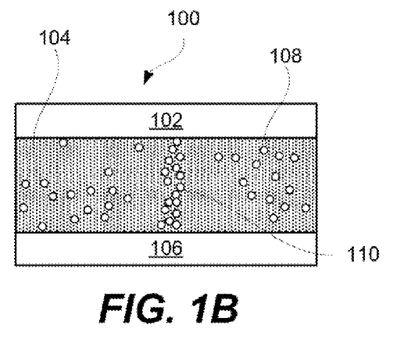

Without being restricted to any particular theory, it is believed that defects 108 can be reoriented within variable resistance layer 104 to form filaments as, for example, schematically shown in FIG. 1B as element 110. This reorientation of defects 108 occurs when a set voltage or a forming voltage is applied to electrodes 102 and 106. Sometimes, reorientation of defects 108 is referred to as "filling the traps" when a set voltage is applied (to form one or more filaments or conduction paths) and "emptying the traps" when a reset voltage is applied (to break the previously formed filaments or conduction paths). Defects 108 can be introduced into variable resistance layer 104 during or after its fabrication. For example, a concentration of oxygen deficiencies can be introduced into metal oxides during their deposition or during subsequent annealing. The distribution of defects within variable resistance layer 104 determines its switching characteristics.

Figure 2:
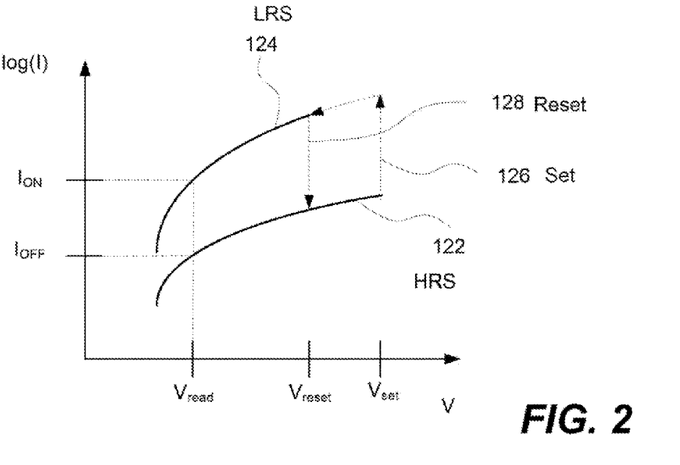
FIG. 2 illustrates a plot of a current passing through a ReRAM cell as a function of a voltage applied to the ReRAM cell, in accordance with some embodiments.

Operation of ReRAM cell 100 will now be briefly described with reference to FIG. 2, which illustrates a logarithmic plot of a current passing through a unipolar ReRAM cell as a function of a voltage applied between the electrodes of the ReRAM cell, in accordance with some embodiments. Similar characteristics are demonstrated by bipolar cells, additional details of which are further presented below. ReRAM cell 100 may be either in a low resistive state (LRS) defined by line 124 or high resistive state (HRS) defined by line 122. Each of these resistive states is used to store a different logic state, e.g., HRS may be read as logic "one" and LRS may be read as logic "zero," or vice versa. Therefore, each ReRAM cell that has two resistive states may be used to store one bit of data. It should be noted that some ReRAM cells may have three and even more resistive states allowing multi-bit storage in the same cell.

HRS and LRS correspond to the presence or absence of one or more filaments or conductive paths in variable resistance layer 104 and of connections between these filaments or conduction paths and the two electrodes 102 and 106. For example, a ReRAM cell may be initially fabricated in LRS and then switched to HRS, or vice versa. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). Set and reset operations may be referred to as write operations. During the read operation, the state of ReRAM cell 100 (more specifically, the resistive state of variable resistance layer 104) can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in variable resistance layer 104 and switches ReRAM cell 100 from its HRS to LRS as indicated by arrow 126. It should be noted that formation or breaking of filaments or conduction paths in variable resistance layer 104 may also involve forming or breaking electrical connections between these filaments and one or both electrodes. The common factor in all these switching mechanisms is passage or blockage of current between the two electrodes.

In LRS, the resistive characteristics of ReRAM cell 100 are represented by line 124. In this LRS, when the read voltage ($V_{READ}$) is applied between electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation, as distinct from the set operation during which ReRAM cell 100 is switched from its HRS to LRS. During the reset operation, a reset voltage ($V_{RESET}$) is applied to ReRAM cell 100 to break the previously formed filaments or conduction paths in variable resistance layer 104, switching ReRAM cell 100 from its LRS to HRS as indicated by arrow 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that, without being bound by theory, are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to variable resistance layer 104. In bipolar switching, the set voltage ($V_{SET}$) and reset voltage ($V_{RESET}$) applied to variable resistance layer 104 have different polarities.

In some embodiments, the set voltage ($V_{SET}$) is between about 100 mV and 10V or, in some embodiments, between about 500 mV and 5V. The length of set voltage pulses ($t_{SET}$) may be less than about 100 milliseconds, less than about 5 milliseconds, or even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, in some embodiments, greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., an $I_{SET}/I_{RESET}$ ratio) that corresponds to a set voltage ($V_{SET}$) and reset voltage ($V_{RESET}$) may be at least about 5 or, in some embodiments, at least about 10 to make the state of ReRAM cell easier to determine. ReRAM cells should be able to cycle between LRS and HRS at least about $10^3$ times or, in some embodiments, at least about $10^7$ times without failure. A data retention time ($t_{RET}$) should be at least about 5 years or, in some embodiments, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20Å of oxide thickness in HRS.

In some embodiments, the same ReRAM cell may include two or more variable resistance layers interconnected in series. Pairs of variable resistance layers may directly contact each other, or they may be separated by one or more intermediate layers.

In some embodiments, a ReRAM cell is subjected to a forming operation, during which the initially insulating properties of the variable resistance layer are altered and the ReRAM cell is configured into the initial LRS or HRS. The forming operation may include a very short high discharge current peak associated with a forming voltage. The LRS level of the variable resistance layer for subsequent switching is determined by the filaments or connections created by the forming operation. If the forming operation makes the resistive-switching layer too conductive, the cell may be difficult to reset. In this case, a variable resistance layer with very low levels of resistance in the LRS may be limited in terms of scaling down. This difficulty may be resolved by positioning such variable resistance layers in series with other components providing additional resistance to the overall ReRAM cell.

Examples of ReRAM Cells Having Embedded Resistors

Figure 3A:
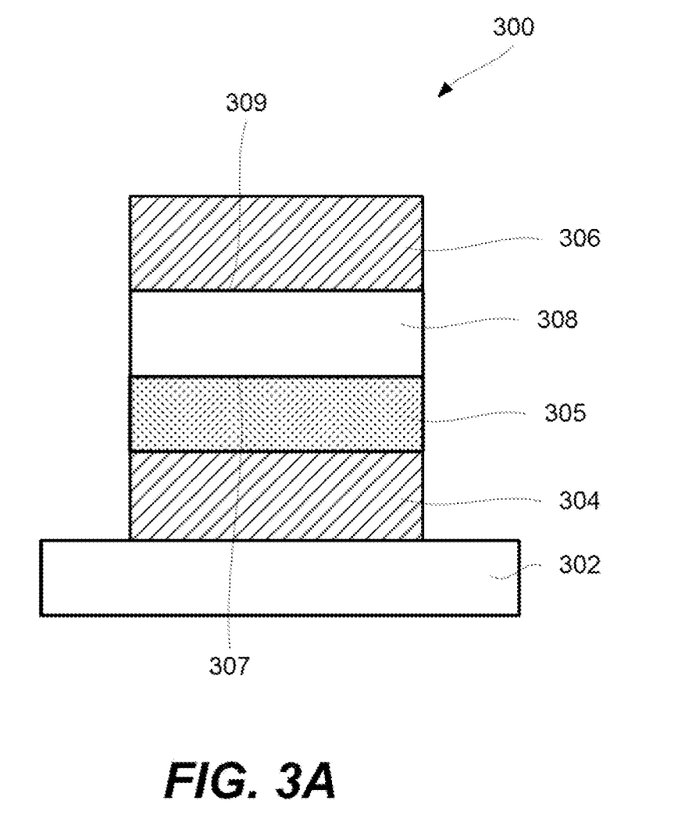
FIG. 3A illustrates a schematic representation of a ReRAM cell including an embedded resistor having nitrides of first and second elements, in accordance with some embodiments.

FIG. 3A is a schematic illustration of ReRAM cell 300, in accordance with some embodiments. ReRAM cell 300 may be disposed on substrate 302 that may include other ReRAM cells, layers, or structures (not shown in FIG. 3A). ReRAM cell 300 includes first electrode 304 and second electrode 306. In some embodiments, first electrode 304 and/or second electrode 306 extend laterally to connect to other ReRAM cells, for example, in a cross-bar arrangement further described below. ReRAM cell 300 also includes variable resistance layer 305 and embedded resistor 308. Variable resistance layer 305 is disposed between first electrode 304 and second electrode 306. Likewise, embedded resistor 308 is disposed between first electrode 304 and second electrode 306. In some embodiments, embedded resistor 308 is disposed between one of first electrode 304 or second electrode 306 and variable resistance layer 305. For example, as shown in FIG. 3A, embedded resistor 308 is disposed between second electrode 306 and variable resistance layer 305.

Embedded resistor 308 includes a first side 307 and a second side 309. The distance between first side 307 and second side 309 maybe referred to as a thickness of embedded resistor 308. In some embodiments, first side 307 directly interfaces with variable resistance layer 305 and/or second side 309 directly interfaces with second electrode 306. Alternatively, other components may be disposed between embedded resistor 308 and variable resistance layer 305 and/or between embedded resistor 308 and second electrode 306. Some of these other components may be interface layers, current steering elements, intermediate electrodes, and the like. Each of these components will now be described in more detail.

Electrodes 304 and 306 provide electrical connections to ReRAM cell 300. For example, electrodes 304 and 306 may extend between multiple ReRAM cells, which may be cells provided in the same row or the same column of a memory array as further described below with reference to FIGS. 6A and 6B. Electrodes 304 and 306 may be made from conductive materials, such as n-doped polysilicon, p-doped polysilicon, titanium nitride, ruthenium, iridium, platinum, and tantalum nitride. Electrodes 304 and 306 may have a thickness of less than about 100 nanometers, such as less than about 50 nanometers or even less than about 10 nanometers. Thinner electrodes may be formed using ALD techniques. Variable resistance layer 305 can be fabricated from a dielectric material, such as a metal oxide material or other similar material that can be switched between two or more stable resistive states. In some embodiments, variable resistance layer 305 does not change phase while being read or written. In some embodiments, variable resistance layer 305 is fabricated from a high bandgap material, e.g., a material that has a bandgap of at least about 4 electron Volts. Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention in ReRAM cell 300 and reduce the current leakage since the amount of trapped charge in these materials is less than a lower bandgap material. Furthermore, the high bandgap materials create a large barrier height that the carriers have to cross during the read, set, and reset operations. Other suitable materials for variable resistance layer 305 include titanium oxide ($TiO_x$), nickel oxide ($NiO_x$), and cerium oxide ($CeO_x$). Furthermore, semi-conductive metal oxide (p-type or n-type), such as zinc oxides ($Zn_xO_y$), copper oxides ($Cu_xO_y$), and their nonstoichiometric and doped variants can be used for variable resistance layer 305.

In some embodiments, variable resistance layer 305 includes a dopant that has an affinity for oxygen, such as various transition metals (e.g., aluminum, titanium, and zirconium), to form a metal-rich variable resistance layer, such as a non-stoichiometric oxide (e.g., $HfO_{1.5}$-$HfO_{1.9}$ or, more specifically, $HfO_{1.7}$). The dopant may be the same material as a metal of the base oxide (e.g., $HfO_2$ doped with hafnium) or different (e.g., $HfO_2$ doped with aluminum, titanium, and zirconium). Oxygen deficiency of the metal-rich variable resistance layer corresponds to a number of oxygen vacancies, which are believed to be defects responsible for resistive switching. The amount of defects is controlled to achieve certain switching and forming voltages, operating currents, improve performance consistency and data retention.

Variable resistance layer 305 may have a thickness of between about 1 nanometers to about 100 nanometers, such as between about 2 nanometers and 20 nanometers or, more specifically, between about 5 nanometers and 10 nanometers. Thinner variable resistance layers may be deposited using atomic layer deposition (ALD), while thicker variable resistance layers may be deposited using may be deposited using ALD as well as physical vapor deposition (PVD) and, in some embodiments, chemical vapor deposition (CVD).

Embedded resistor 308 can include a first element, a second element different from the first element, and nitrogen. Neither first element nor the second element is nitrogen. More specifically, embedded resistor 308 may include a nitride of the first element (i.e., the first nitride) and a nitride of the second element (i.e., the second nitride). Theses nitrides may have different properties, such as different conductivities, different diffusion characteristics. For example, the first nitride may be more conductive than the second nitride. The overall volume ration (or the weight ratio) of embedded resistor may be specifically controlled by changing the amount of the first nitride and the second nitride in embedded resistor.

Figure 3B:
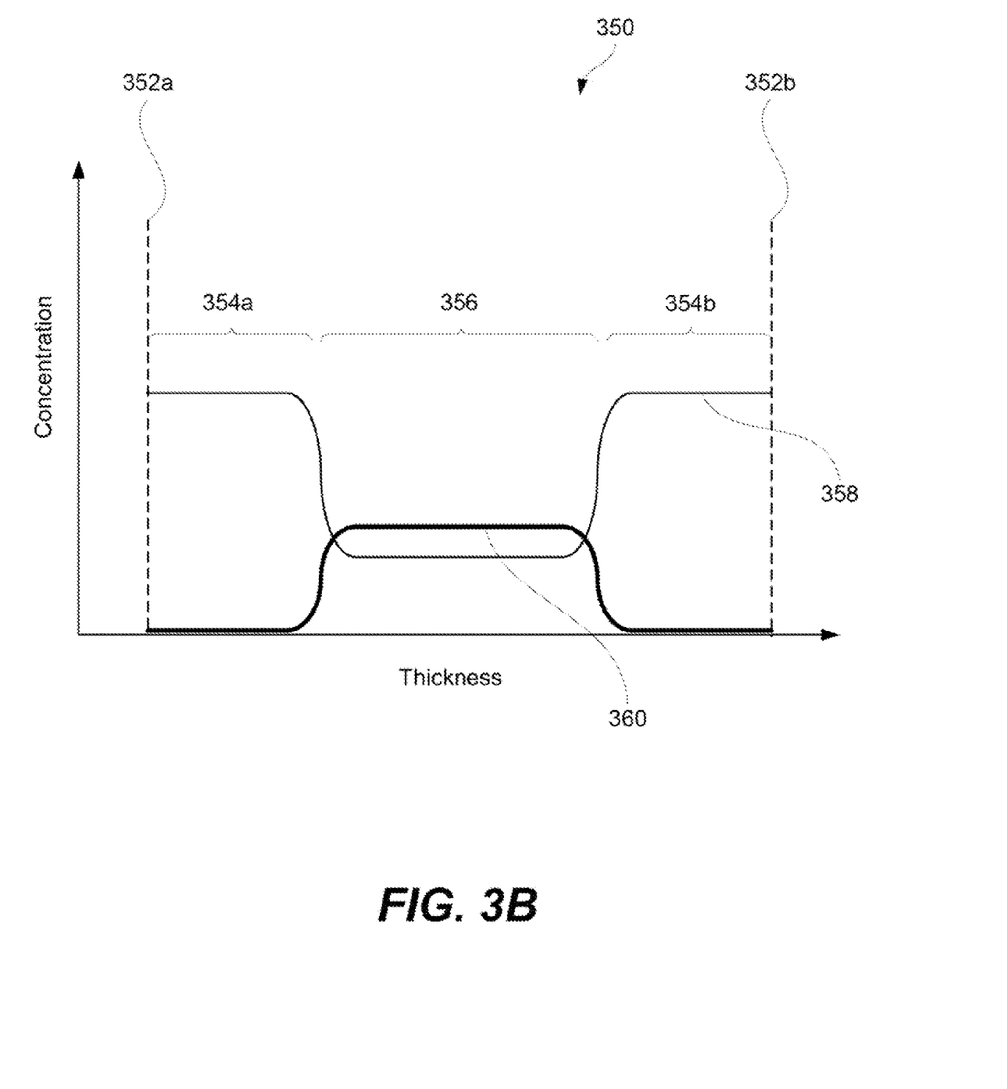
FIG. 3B is an illustrative plot of concentration profiles of two different elements in an embedded resistor, in accordance with some embodiments.

In some embodiments, the first element of the first nitride may be one of hafnium, tantalum, titanium, zirconium, chromium, nickel, or cobalt. The second element may be one of aluminum, silicon, germanium, sulfur, selenium, or gallium. For example, the embedded resistor may include hafnium silicon nitride, hafnium aluminum nitride, tantalum silicon nitride, or tantalum aluminum nitride. The concentration of the first element and/or the second element may vary throughout the thickness of the variable resistance layer as will now be described with reference to FIG. 3B. Specifically, FIG. 3B illustrates a plot 350 of concentration profiles of two different elements within an embedded resistor, in accordance with some embodiments. The concentration profiles are presented as a function of the position within the embedded resistor. Dashed lines 352a and 352b represent different interface surfaces of the embedded resistor. Line 358 corresponds to the concentration profile of the first element, while line 360 corresponds to the concentration profile of the second element.

The concentration of the first element may be the highest at each side of the embedded resistor as, for example, shown in FIG. 3B. The zones where the concentration of the first element is the highest may be referred to as diffusion barrier zones 354a and 354b. Diffusion barrier zones 354a and 354b are separated by resistive tuning zone 356 in which the concentration of the first element is less than in diffusion barrier zones 354a and 354b. For example, resistive tuning zone 356 may include two nitrides having different resistivities. The amounts of these nitrides in resistive tuning zone 356 determine the overall resistance of this zone. The amounts and/or materials may be changed to achieve different resistivity. Diffusion barrier zones 354a and 354b may be configured to prevent migration of different components into resistive tuning zone 356 thereby ensuring consistent resistance of the embedded resistor. For example, an embedded resistor may be interfacing a variable resistance layer formed from a metal oxide. Many nitrides that may be heat and electrically stable may be susceptible to oxidation. These nitrides may be used as second nitrides and be separated from the metal oxide of the variable resistance layer by the first nitride.

The concentration of the second element in diffusion barrier zones 354a and 354b may be the lowest. In some embodiments, diffusion barrier zones 354a and 354b are substantially free from the second element and are almost entirely formed from the first oxide. At the same time, the concentration of the second element in resistive tuning zone 356 may the highest. In some embodiments, the first element may also be present in resistive tuning zone 356. However, the concentration of the first element may be less than the concentration of the second element in resistive tuning zone 356. The concentrations of different elements may be used to tune the overall resistance. In some embodiments, diffusion barrier zones 354a and 354b may be substantially free from the second element. In other words, the concentration of the second element in diffusion barrier zones 354a and 354b or at least at interface surfaces 352a and 352b may be about 0% atomic. The relative sizes of diffusion barrier zones 354a and 354b and resistive tuning zone 356 may be selected based on the overall resistance requirement, the thickness of the embedded resistor (i.e., the distance between interface surfaces 352a and 352b), resistivity of each nitride, and composition of each zone. In some embodiments, diffusion barrier zones 354a and 354b represent more than 50% of the thickness of the embedded resistor. In this example, the second element is present in less than about 50% of a thickness of the variable resistance layer. In some embodiments, an atomic ratio of the second element to a combination of the first element and the second element is between about 0% and 10% or, more specifically, between about 1% and 5% for the overall embedded resistor.

Processing Examples

Figure 4:
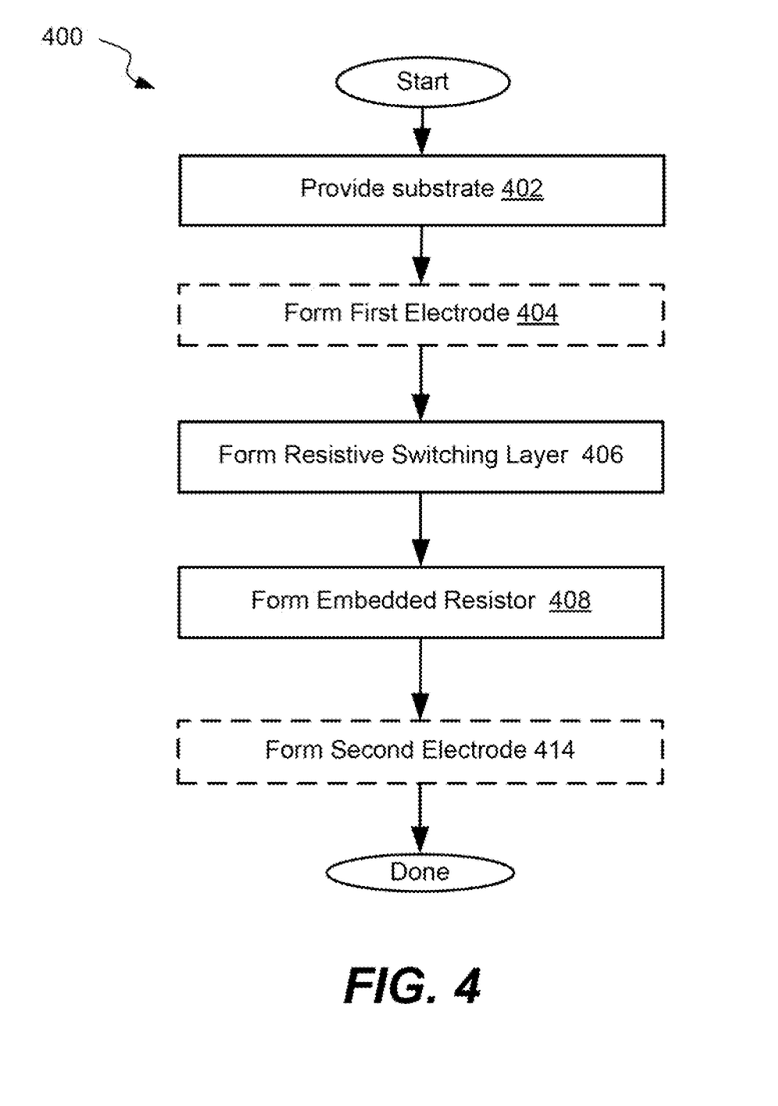
FIG. 4 illustrates a process flowchart corresponding to a method of fabricating a ReRAM cell using MOCVD to form an embedded resistor of the ReRAM cell, in accordance with some embodiments.

FIG. 4 illustrates a process flow chart corresponding to method 400 of fabricating a resistive random access memory cell including an embedded resistor, in accordance with some embodiments. Method 400 may commence with providing a substrate during operation 402. In some embodiments, the substrate may include a first electrode and a variable resistance layer, in which case method 400 may proceed with forming a variable resistance layer during operation 406 or forming an embedded resistor during operation 408. Alternatively, method 400 may proceed with forming a first electrode on the substrate during optional operation 404 and then forming a variable resistance layer over the first electrode during operation 406 or forming a variable resistance layer over the first electrode during operation 408. The variable resistance layer may be formed before forming the embedded resistor or after forming the embedded resistor.

In some embodiments, operation 404 may involve forming a titanium nitride electrode using sputtering. Deposition of the titanium nitride electrode may be performed using a titanium target in a nitrogen atmosphere maintained at a pressure of between about 1-20 mTorr. The power density may be maintained at 3.3-11 W/cm$^2$ (150-500 Watts on a 3" diameter target) that may result in a deposition rate of about 0.05-0.5 nanometers per second (depending on the size of the target sample and other process parameters). Some of the provided process parameters are for illustrative purposes only and generally depend on deposited materials, tools, deposition rates, and other factors.

Method 400 may proceed with forming a variable resistance layer during operation 406. The variable resistance layer may be deposited using PVD or other suitable techniques. For example, a hafnium oxide layer having a thickness of between about 0.5-50 nanometers may be formed using reactive sputtering by employing a metal hafnium target in a 20-60% oxygen atmosphere. Power of 100-1000 Watts (W) may be used to achieve deposition rates of between about 0.01 and 0.1 nanometers per second. These process parameters are provided as examples and generally depend on deposited materials, tools, deposition rates, and other factors. Other processing techniques, such as ALD, PLD, CVD, evaporation, and the like can also be used to deposit the variable resistance layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride (HfCl$_4$), and a suitable oxidant, such as water, oxygen plasma, or ozone.

A variable resistance layer may include multiple metals. For example, one metal may be used to dope an oxide of another metal. Two or more metals may be co-deposited to form one common layer or deposited in sequences to form multiple sub-layers of the variable resistance layer. For example, PVD may be used to deposit a layer containing hafnium oxide and aluminum oxide. Specifically, a co-sputtering arrangement using either a hafnium target and an aluminum target in an oxygen containing atmosphere or a hafnium oxide target and an aluminum oxide target may be used. In another example, ALD may be used to co-inject hafnium and aluminum precursors at desired proportions to co-deposit a metal oxide layer or to form multiple sub-layers. In some embodiments, operation 404 may involve ion implantation. The ion implantation can isovalently or aliovalently dope the variable resistance layer and can reduce forming voltages, improve set and reset voltage distributions, and increase device yield.

In some embodiments, the variable resistance layer may be formed using an MOCVD technique. For example, the variable resistance layer may include one or two oxides configured to resistively switch when switching voltages are applied to the layer. When multiple oxides are used, these oxides may have various distribution profiles. For example, one oxide may have a peak concentration away from the interface surface of the variable resistance layer. When the variable resistance layer is formed using MOCVD, the embedded resistor may be formed in situ in the same deposition chamber. As such, the embedded resistor and the variable resistance layer may be formed in two sequential operations or even a single operation without exposing a partially fabricated ReRAM to the environment in between these depositions.

Method 400 may proceed with forming an embedded resistor using an MOCVD technique during operation 408. The embedded resistor formed during this operation includes a first element, a second element, and nitrogen such that the first element is different form the second element and neither one of these two elements is nitrogen. The first element may be supplied as a part of a first precursor or, more specifically, a first metal organic precursor. The second element may be supplied as a part of a second precursor or, more specifically, a second metal organic precursor. Overall, operation 408 may involve flowing the first metal organic precursor and flowing the second metal organic precursor into a MOCVD chamber. The flow rates of the first metal organic precursor and the second metal organic precursor may be dynamically varied while forming the embedded resistor. This variation of the flow rates results in the variable concentrations of the first element and the second element in the embedded resistor. The dynamic variation of the flow rates is performed while continuously forming the embedded resistor. As such, at least one precursor may be always flowing into the deposition chamber at all times during operation 408. The composition of precursors flowing into the chamber may change. In some embodiments, forming the embedded resistor during operation 408 starts and ends with the second metal organic precursor not flowing into the MOCVD chamber. As such, the second element may not be present at either side of the embedded resistor.

In some embodiments, the first metal organic precursor may not flow into the MOCVD chamber for a period of time during operation 408. For example, operation 408 may start with flowing the first metal organic precursor into the chamber. Then the flow of the first metal organic precursor may be stopped for a period of time and then restarted. The first metal organic precursor may not flow into the chamber at the time when the second metal organic precursor flows into the MOCVD chamber.

In some embodiments, forming the embedded resistor during operation 408 also involves flowing a nitrogen containing precursor into the MOCVD chamber. The flow rate of the nitrogen containing precursor may be dynamically varied while forming the embedded resistor. For example, the flow rate of the nitrogen containing precursor may be reduced when the second metal organic precursor flow into the MOCVD chamber in order, for example, to form a non-stoichiometric nitride of the second element.

In some embodiments, the first metal organic precursor and the second metal organic precursor flow into the MOCVD chamber at the same time for at least a period of time while forming the embedded resistor. For example, operation 408 may start with flowing the first metal organic precursor into the chamber. The second metal organic precursor may not flow into the chamber at least initially. The flow rate of the first metal organic precursor may be then reduced, while the flow rate of the second metal organic precursor may be increased. As such, for a period of time, both precursors may flow into the chamber. At some point, the first metal organic precursor may stop flowing into the chamber and only the second metal organic precursor may flow in. Operation 408 may proceed with reducing the flow rate of the second metal organic precursor and reintroducing the first metal organic precursor into the chamber. Again, for another period of time, both precursors may flow into the chamber. At some point, the second metal organic precursor may stop flowing into the chamber and only the first metal organic precursor may flow in.

In some embodiments, forming an embedded resistor is performed in a continuous manner. In other words, the substrate is not removed from the MOCVD chamber until the embedded resistor is formed. Furthermore, one or more precursors may continuously flow into the MOCVD chamber while forming the embedded resistor. The compositions of these precursors may change while forming the embedded resistor. However, at least one or both of the precursors may be supplied into the chamber at all times during operation 408.

Examples of aluminum containing precursors include aluminum acetylacetonate ($Al(CH_3COCHCOCH_3)_3$), aluminum s-butoxide ($Al(OC_4H_9)_3$), aluminum ethoxide ($Al(OC_2H_5)_3$), aluminum hexafluoroacetylacetonate ($Al(CF_3COCHCOCF_3)_3$), aluminum isopropoxide ($Al[OCH(CH_3)_2]_3$), dimethylaluminum i-propoxide (($(CH_3)_2Al(OC_3H_7)$)), tri-i-butylaluminum (($(C_4H_9)_3Al$)), triethylaluminum (($(C_2H_5)_3Al$)). Examples of hafnium containing precursors include bis(cyclopentadienyl)dimethylhafnium (($(C_5H_5)_2Hf(CH_3)_2$)), hafnium t-butoxide ($Hf[OC(CH_3)_3]_4$), hafnium ethoxide ($Hf_4O(OC_2H_5)_{14}.2C_2H_5OH$), tetrakis(diethylamino)hafnium ($Hf[N(CH_2CH_3)_2]_4$), tetrakisdiethylaminohafnium ($Hf[N(CH_3)(CH_2CH_3)]_4$). Examples of silicon containing precursors include 3-aminopropyltriethoxysilane ($H_2N(CH_2)_3Si(OC_2H_5)_3$), tetrabutoxysilane ($Si(OC_4H_9)_4$), and tetraethoxysilane ($Si(OC_2H_5)_4$).

In some embodiments, a method of fabricating a ReRAM cell involves providing a substrate including a conductive layer operable as an electrode. The substrate may be at the temperature of between about 300° C. and 450° C. The method may proceed with forming an embedded resistor over the conductive layer. This forming operation may involve: flowing tris(diethylamido) (tert-butylimido) tantalum and a nitrogen containing precursor into a MOCVD chamber, reducing the flow rate of tris(diethylamido) (tert-butylimido) tantalum and increasing the flow rate of tris(dimethylamino) silane, and then increasing the flow rate of tris(diethylamido) (tert-butylimido) tantalum and stopping the flow of tris(dimethylamino) silane.

Method 400 may proceed with forming a second electrode during operation 414. This operation would be understood by one having ordinary skills in the art and, in some embodiments, may the same as or similar to operation 404 described above.

Apparatus Examples

Figure 5:
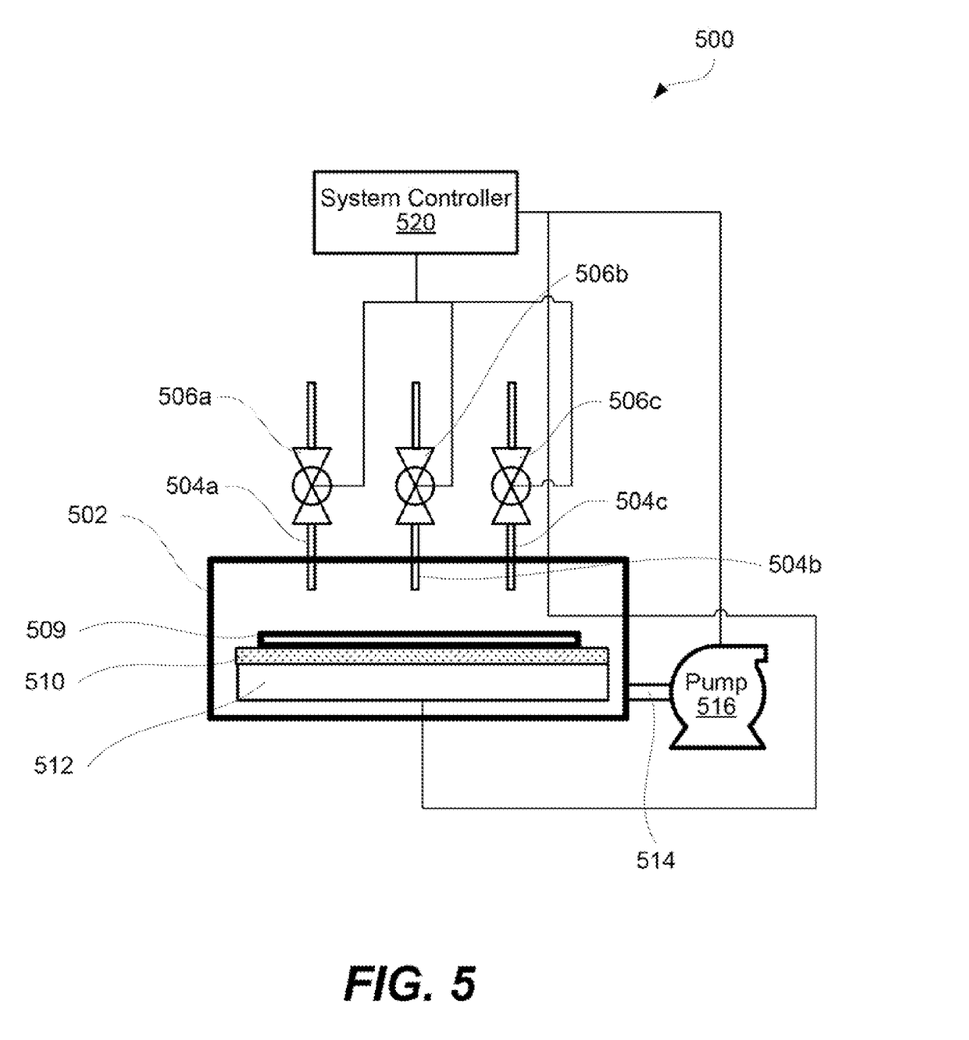
FIG. 5 illustrates a schematic representation of a MOCVD apparatus for fabricating ReRAM cells, in accordance with some embodiments.

FIG. 5 is a schematic diagram of a MOCVD apparatus 500, in accordance with some embodiments. MOCVD apparatus 500 includes a deposition chamber 502 configured to receive and to enclose a substrate 509 during deposition of various layers on substrate 509. Specifically, substrate 509 may be supported by a susceptor 510 that may be coupled to a heater 512. A combination of susceptor 510 and heater 512 may be designed to maintain the temperature of substrate 509 at a desired level as specified above. Heater 512 may provide inductive heating, radiation heating, resistive heating, and/or other forms of heating. Furthermore, susceptor 510 or the combination of susceptor 510 and heater 512 may be used to rotate substrate 509 relative to gas delivery lines 504a-504c to ensure uniform gas concentrations on the substrate surface. Heater 512 and/or susceptor 510 may be controlled by system controller 520 to ensure desirable temperature of substrate 509 as well as desirable position and/or motion of substrate 509 relative to gas delivery lines 504a-504c.

While substrate 509 is heated to a certain processing temperature to stimulate a chemical reaction on the surface, components of MOCVD apparatus may be kept cold to prevent this reaction on the surfaces of these components. For example, walls of deposition chambers may be coupled to a heat exchanger to control the temperature of the walls.

One or more delivery lines 504a-504c may extend into the chamber for delivering precursors (e.g., metal organic precursors), oxidizing agents, other reagents, inert gases, and other components. While FIG. 5 illustrates three delivery lines 504a-504c, any number of lines may be used and within the scope of this disclosure. In some embodiments, one or more precursors may be delivered using the same line. The flow in each delivery line may be controlled using one of valves and/or mass flow controllers 506a-506c. Operation of valves 506a-506c may be controlled by system controller 520. Delivery lines 504a-504c may be separated so that the reactive gases do not react until they reach the substrate surface.

The reaction products, unreacted precursors, and purge gases are removed from deposition chamber 502 through an exhaust line 514 using, for example, vacuum pump 516. Vacuum pump 516 may be controlled by system controller 520 in order to maintain a desired pressure level inside deposition chamber 502.

Apparatus 500 may include system controller 520 for controlling process conditions during formation of various ReRAM components, such as embedded resistors, and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, and other parameters. Other computer programs and instruction stored on memory devices associated with controller may be employed in some embodiments.

Memory Array Examples

Figure 6A:
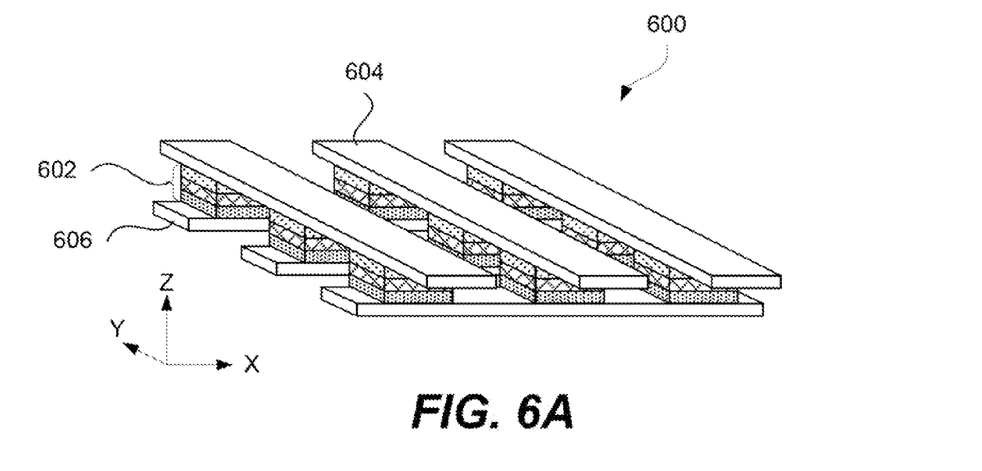
FIGS. 6A and 6B illustrate schematic views of memory arrays including multiple ReRAM cells, in accordance with some embodiments.

A brief description of memory arrays will now be described with reference to FIGS. 6A and 6B to provide better understanding of various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, variable resistance layer, embedded resistors, embedded current steering elements, and the like, some of which are further described elsewhere in this document. In some embodiments, a ReRAM cell includes multiple variable resistance layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices, each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, in some embodiments, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, in some embodiments, embedded into each cell to decouple the cell if it is not addressed. This approach significantly reduces crosstalk in the matrix of the memory device.

Figure 6B:
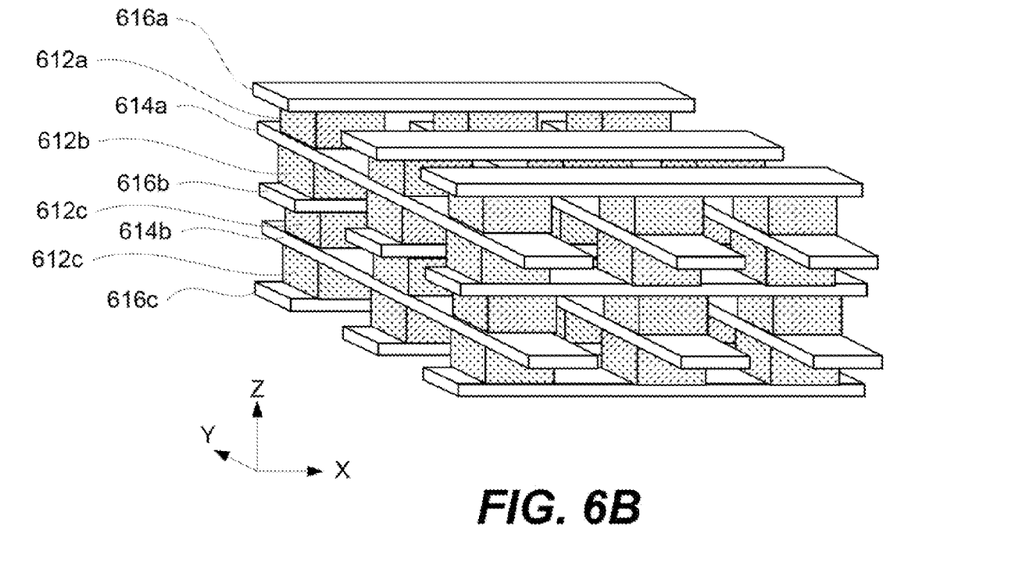

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets of ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of fabricating a resistive random access memory cell, the method comprising:
   providing a substrate;
   forming a conductive layer over the substrate,
      wherein the conductive layer is operable as an electrode;
   forming an resistor over the conductive layer by metal organic chemical vapor deposition (MOCVD),
      wherein the resistor comprises a first element, a second element, and nitrogen, wherein forming the resistor comprises flowing a first precursor comprising the first element in a MOCVD chamber and flowing a second precursor comprising the second element in the MOCVD chamber, wherein flowrates of the first precursor and the second precursor into the MOCVD chamber are dynamically varies while forming the resistor resulting in variable concentrations of the first element and the second element throughout a thickness of the resistor; and forming a variable resistance layer over the conductive layer.

2. The method of claim 1, wherein the first element forms a first nitride; wherein the second element forms a second nitride; and wherein the first nitride is more conductive than the second nitride.

3. The method of claim 1, wherein the first element comprises one of hafnium, tantalum, titanium, zirconium, chromium, nickel, or cobalt, and wherein a concentration of the first element is lowest away from interface surfaces of the resistor.

4. The method of claim 3, wherein the second element comprises one of aluminum, silicon, germanium, sulfur, selenium, or gallium.

5. The method of claim 1, wherein an atomic ratio of the second element to a combination of the first element and the second element is between about 1% and 5%.

6. The method of claim 1, wherein the resistor comprises one of hafnium silicon nitride, hafnium aluminum nitride, tantalum silicon nitride, or tantalum aluminum nitride.

7. The method of claim 1, wherein a concentration of the second element at a first or second side of the resistor is about 0% atomic.

8. The method of claim 7, wherein the second element is present in less than about 50% of the thickness of the resistor.

9. The method of claim 1, wherein forming the resistor starts or ends with the second precursor not flowing into the metal organic chemical vapor deposition chamber.

10. The method of claim 9, further comprising decreasing the flow rate of the first precursor while forming the resistor.

11. The method of claim 1, wherein forming the resistor further comprises flowing a nitrogen containing precursor into the metal organic chemical vapor deposition chamber, wherein a flow rate of the nitrogen containing precursor is dynamically varied while forming the resistor.

12. The method of claim 1, wherein the variable resistance layer is deposited using metal organic chemical vapor deposition.

13. The method of claim 1, wherein the variable resistance layer is deposited using atomic layer deposition.

14. The method of claim 1, wherein the variable resistance layer is formed before forming the resistor, and wherein the resistor is formed over the variable resistance layer.

15. The method of claim 1, wherein the variable resistance layer is formed after forming the resistor, and wherein the variable resistance layer is formed over the resistor.

16. The method of claim 1, wherein the resistor has a thickness of between about 10 nanometers and 50 nanometers.

17. The method of claim 1, wherein the substrate is not removed from the MOCVD chamber until the resistor is formed.

18. The method of claim 1, wherein the resistor comprises hafnium silicon nitride.

19. The method of claim 1, wherein the resistor comprises hafnium aluminum nitride.

20. The method of claim 1, wherein the resistor comprises tantalum aluminum nitride.

\* \* \* \* \*